(12) United States Patent
Han et al.

(10) Patent No.: US 7,544,972 B2
(45) Date of Patent: *Jun. 9, 2009

(54) ORGANIC ELECTROLUMINESCENT DISPLAY DEVICE AND METHOD OF PREPARING THE SAME

(75) Inventors: Dong-Won Han, Suwon-si (KR);
Jin-Woo Park, Suwon-si (KR);
Jang-Hyuk Kwon, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 119 days.

This patent is subject to a terminal disclaimer.

(21) Appl. No.: 11/149,237

(22) Filed: Jun. 10, 2005

(65) Prior Publication Data

US 2005/0277222 A1    Dec. 15, 2005

(30) Foreign Application Priority Data

Jun. 10, 2004    (KR) .................... 10-2004-0042508
Jun. 10, 2004    (KR) .................... 10-2004-0042509

(51) Int. Cl.
*H01L 31/153* (2006.01)
(52) U.S. Cl. .................... 257/95; 257/13; 257/84; 257/E33.074
(58) Field of Classification Search .......... 257/E33.074, 257/13, 95, E33.073, 84
See application file for complete search history.

(56) References Cited

U.S. PATENT DOCUMENTS

| | | | |
|---|---|---|---|
| 6,319,867 B1 * | 11/2001 | Chacon et al. ............... 501/66 |
| 6,406,802 B1 * | 6/2002 | Arai et al. ................... 428/690 |
| 6,602,606 B1 * | 8/2003 | Fujisawa et al. ............ 428/432 |
| 2001/0035713 A1 * | 11/2001 | Kimura ...................... 313/501 |
| 2004/0259387 A1 * | 12/2004 | Yamazaki et al. ........... 438/795 |
| 2005/0285510 A1 * | 12/2005 | Han et al. ................... 313/504 |

FOREIGN PATENT DOCUMENTS

| | | |
|---|---|---|
| CN | 1501750 | 6/2004 |
| KR | 10-2001-0067868 | 7/2001 |
| WO | 02-091064 | 11/2002 |

OTHER PUBLICATIONS

Chinese Office Action dated Oct. 10, 2008.

* cited by examiner

*Primary Examiner*—Howard Weiss
*Assistant Examiner*—John C Ingham
(74) *Attorney, Agent, or Firm*—H.C. Park & Associates, PLC

(57) ABSTRACT

An organic electroluminescent display device and a method of preparing the same are provided. The organic electroluminescent display device may include a first electrode formed on a substrate. A second electrode may be formed so as to be insulated from the first electrode. One or more organic layers may be interposed between the first electrode and the second electrode and include at least an emission layer. A protective layer may be formed so as to cover the second electrode. The protective layer may have a surface roughness (rms) of about 5 Å to about 50 Å. The organic electroluminescent display device including a protective layer having a low surface roughness may benefit from superior lifespan characteristics.

9 Claims, 5 Drawing Sheets

ORGANIC ELECTROLUMINESCENT DISPLAY DEVICE AND METHOD OF PREPARING THE SAME

BACKGROUND OF THE INVENTION

This application claims priority to Korean Patent Application No. 10-2004-0042508, filed on Jun. 10, 2004 and to Korean Patent Application No. 10-2004-0042509, filed on Jun. 10, 2004, in the Korean Intellectual Property Office, the disclosures of which are herein incorporated by reference in their entireties.

FIELD OF THE INVENTION

The present invention relates generally to flat panel display devices and methods of fabricating the same and, more particularly, to an organic electroluminescent display (OLED) device having a protective layer that may provide superior resistance to moisture and oxygen infiltration, and to a method of manufacturing the same.

DESCRIPTION OF RELATED ART

Flat panel displays may be categorized as emission devices or as non-emission devices. Examples of emission devices are a flat cathode ray tube (CRT), a plasma display panel, an electroluminescent device, and a light emitting diode. An example of a non-emission device is a liquid crystal display (LCD). Of these display devices, electroluminescent devices have wider viewing angles, faster video response speeds, and lower power consumption than the conventional CRT displays. Other advantages over CRTs include increased brightness, lighter weight, improved durability, and expanded ranges of operating temperatures. OLEDs may be classified as organic or inorganic depending on the type of material that forms the OLEDs' emission layer. For these and other reasons, OLEDs are considered to be next-generation replacements of CRT displays.

An OLED device includes an emission layer composed of an organic compound that is sandwiched between an anode and a cathode. When voltages are applied to the anode and cathode, holes from the anode migrate, via a hole transport layer, to an emission layer. Electrons from the cathode migrate, via an electron hole transport layer (ETL), to the emission layer, in which the electrons and holes recombine to generate exitons. As the exitons fall from their excited states to a ground state, they cause fluorescent molecules of the emission layer to emit light. Images are formed by selectively switching patterns of unit pixels regions on and off. Full color OLED devices have pixels that emit one of three light colors, namely red (R), green (G), or blue (B).

To ensure a long operating life, the emission layer and the cathode on the emission layer should be shielded from moisture to be protected from oxidation and shielded from oxygen infiltration to be protected from exfoliation. An example of shielding is set forth in Korean Patent Publication No. 2001-0067868, which discloses forming a layer of an insulating polymer compound, such as high density polyethylene, on an emission layer and a metal electrode using a vacuum system; forming a layer of an inorganic metal on the polymer compound layer; forming a layer of an insulating inorganic metal on the inorganic metal layer; and forming a layer of an insulating polymer compound on the insulating inorganic metal layer. Nevertheless, the lifespan of the OLED taught by the Korean Patent Publication No. 2001-0067868 does not reach satisfactory levels and offers poor light extraction efficiency, and thus improvement is needed.

SUMMARY OF THE INVENTION

The present invention provides an organic electroluminescent display (OLED) device having a protective layer that offers superior resistance to moisture and oxygen infiltration and a method of fabricating the same. Additionally, the OLED of the present invention may provide a high efficiency of light extraction.

An embodiment of the present invention provides an organic electroluminescent display device having a first electrode formed on a substrate. A second electrode may be formed so as to be insulated from the first electrode. One or more organic layers may be interposed between the first electrode and the second electrode and may include an emission layer. A protective layer may be formed so as to cover the second electrode, wherein the protective layer has a surface roughness (rms) of about 5 Å to about 50 Å.

The protective layer may comprise at least one material selected from a group consisting of metal oxides and metal nitrides.

Another embodiment of the invention provides an organic electroluminescent display device having a first electrode formed on a substrate. A second electrode may be formed so as to be insulated from the first electrode. One or more organic layers may be interposed between the first electrode and the second electrode and may include at least an emission layer. A protective layer may be formed so as to cover the second electrode, and the protective layer may comprise a network former-containing insulating material.

The present invention also provides a method of manufacturing an organic electroluminescent display device. The method may include forming a first electrode on a substrate part; forming one or more organic layers having at least an emission layer on the first electrode; forming a second electrode so as to cover the organic layer; and forming a protective layer so as to cover the second electrode, wherein the protective layer is formed using an ion beam assisted deposition (IBAD) technique that includes an evaporation source and an ion beam source.

The present invention further provides a method of fabricating an organic electroluminescent display device. The method may include forming a first electrode on a substrate part; forming one or more organic layers having at least an emission layer on the first electrode; forming a second electrode so as to cover the organic layer; and forming a protective layer so as to cover the second electrode, wherein the protective layer comprises a network former-containing insulating material.

OLED device of the present invention as described above may improved reliability, in particular, lifespan and luminance due to the protective layer offering superior resistance to moisture and oxygen infiltration and improved efficiency of light extraction.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

An active matrix organic electroluminescent display (OLED) device manufactured according to the principles of the present invention may include repeated red, green and blue pixels. The respective color pixels may be arranged so as to have various mosaic patterns, lattice patterns, and similar patterns. Numbers of pixels may be arranged in a display region of the organic electroluminescent display device to implement a predetermined image. The respective pixels of the display region may include a selective driving circuit having two thin film transistors (TFTs), i.e., a switching TFT and a driving TFT. The respective pixels may also include a capacitor and an organic electroluminescent device. The number of TFTs and capacitors of the selective driving circuit is not limited and may vary depending on a design of the desired device.

Figure 1:
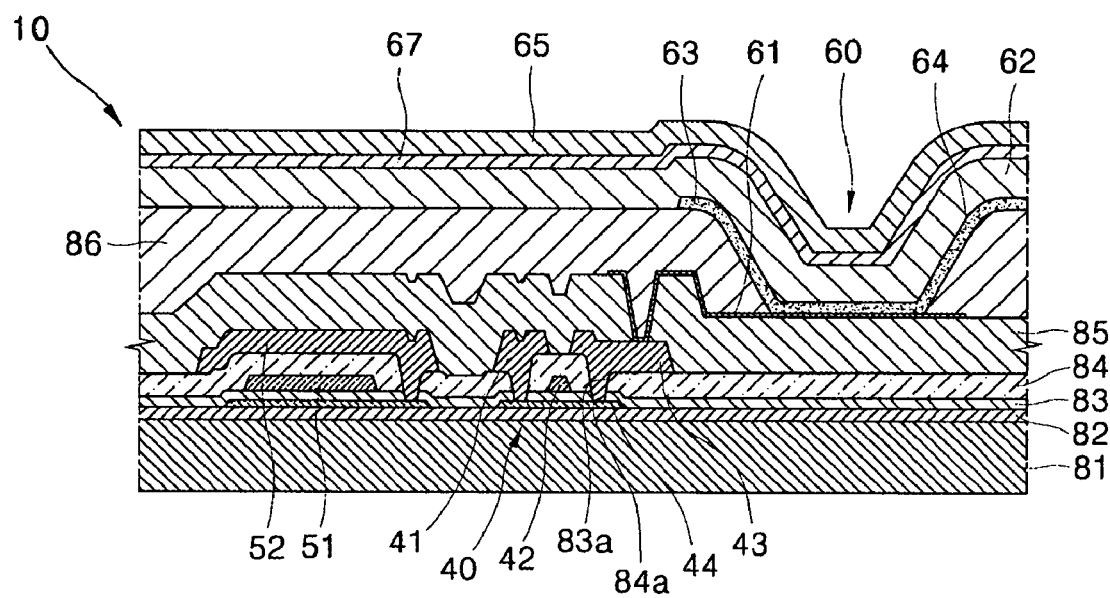
FIG. 1 is a cross-sectional view of an organic electroluminescent display device according to an embodiment of the present invention.

FIG. 1 is a cross-sectional view of one embodiment of an active matrix OLED device 10 manufactured according to the principles of the present invention. Referring to FIG. 1, the active matrix OLED device 10 includes a substrate 81. The substrate 81 may comprise a transparent material such as glass or plastic. A buffering layer 82 may be formed on the entire surface of the substrate 81.

An active layer 44 arranged in a predetermined pattern may be formed on the buffering layer 82. The active layer 44 may be embedded within a gate insulating layer 83. The active layer 44 may be doped as either a p-type or n-type semiconductor.

A gate electrode 42 of a TFT 40 may be formed on the gate insulating layer 83 in a region corresponding to the active layer 44. The gate electrode 42 may be embedded in an intermediate insulating layer 84. After forming the intermediate insulating layer 84, the gate insulating layer 83 and the intermediate insulating layer 84 may be etched by an etching process such as dry etching to form contact holes 83a, 84a, thereby exposing a part of a source region and a drain region of the active layer 44.

A source electrode 41 is coupled to the source region through contact holes 83a, 84a, and a drain electrode is coupled to the drain region through contact holes 83a and 84a. The source electrode 41 and the drain electrode 43 may be embedded in a protective layer 85. After forming the protective layer 85, a portion of the drain electrode 43 is exposed through an etching process.

The protective layer 85 comprises an insulator and may be an inorganic layer, such as silicon oxide or silicon nitride, or an organic layer, such as acryl or BCB. A separate insulating layer for planarization of the protective layer 85 may be further formed on the protective layer 85.

An organic electroluminescent device 60 emits red (R), green (G) or blue (B) light depending on the application of an electric current. When the light emitted from the organic electroluminescent device 60 combines with the light emitted from the organic electroluminescent devices, a predetermined image may be displayed. The organic electroluminescent device 60 may include a first electrode 61 as a pixel electrode that connects to the drain electrode 43 of the driving TFT 40. It may further include a second electrode 62 as a counter electrode provided so as to completely cover the entire pixel, and an organic emission layer 63 interposed between the first electrode 61 and the second electrode 62.

The first electrode 61 and the second electrode 62 may be insulated from each other. To emit light, each electrode may apply voltages of different polarity to the organic emission layer 63.

The organic emission layer 63 may comprise a low molecular or high molecular weight organic material. When using a low molecular weight organic material, a hole injection layer (HIL), a hole transport layer (HTL), an emission layer (EML), an electron transport layer (ETL), an electron injection layer (EIL), and the like may be deposited in a single or multi-layered structure. Examples of the available organic material include copper phthalocyanine (CuPc), N,N'-di (naphthalene-1-yl)-N,N'-diphenyl-benzidine (NPB), tris-8-hydroxyquinoline aluminum (Alq3), and the like. The layers of these low molecular weight organic materials may be formed by vacuum evaporation.

When using a high molecular weight organic material, the emission layer 63 may include an HTL and an EML. PEDOT may be used for the HTL. A high molecular weight organic material, such as poly-phenylenevinylene (PPV) based compounds, and polyfluorene based compounds may be used for the EML. One or more layers of these materials may be formed by screen printing or inkjet printing.

The organic emission layer is not limited to the embodiments as described above and various embodiments can be applied. The first electrode 61 and the second electrode 62 may act as an anode and as a cathode, respectively, and their functions may be reversed. The first electrode 61 may be patterned so as to correspond to a region of each pixel and the second electrode 62 may be formed so as to completely cover the entire pixel.

The first electrode 61 may be fabricated either as a transparent electrode or a reflective electrode. When the first electrode 61 is a transparent electrode, it may comprise ITO, IZO, ZnO, or $In_2O_3$. When the first electrode 61 is used as a reflective electrode, it may be formed by first forming a reflective layer comprising Ag, Mg, Al, Pt, Pd, Au, Ni, Nd, Ir, Cr, or a combination thereof, and then forming a transparent electrode layer comprising ITO, IZO, ZnO, or $In_2O_3$ thereon. Meanwhile, the second electrode 62 may also be fabricated as either a transparent electrode or a reflective electrode. When the second electrode 62 is used as the transparent electrode, since it is a cathode, a metal with low work function, i.e., Li, Ca, LiF/Ca, LiF/Al, Al, Ag, Mg, or a combination thereof may be deposited on the organic emission layer 63. An auxiliary electrode layer or bus electrode line composed of ITO, IZO, ZnO, or $In_2O_3$ may be formed on the low work function metal. When the second electrode 62 is a reflective electrode, it may be formed by depositing Li, Ca, LiF/Ca, LiF/Al, Al, Ag, Mg, or a combination thereof on the entire surface of the organic emission layer 63.

A protective layer 65 may be formed on the second electrode 62. Element 67 may be any layer that can be interposed between the protective layer 65 and second electrode 62. For example, element 67 may be a buffer layer, a layer for controlling a refractive index of the light extracted from an organic layer, etc. Alternatively, element 67 may be omitted so that the protective layer 65 may be formed directly on the second electrode 62. The surface roughness (rms) of the protective layer 65 may be in the range of about 5 Å to about 50

Å. Such a low surface roughness results from the high density of atoms that constitutes the protective layer 65. When the surface roughness of the protective layer 65 is greater than about 50 Å, a protective layer having compact structure may not be formed, and thus moisture and oxygen infiltration may not be effectively prevented.

Figure 2A:
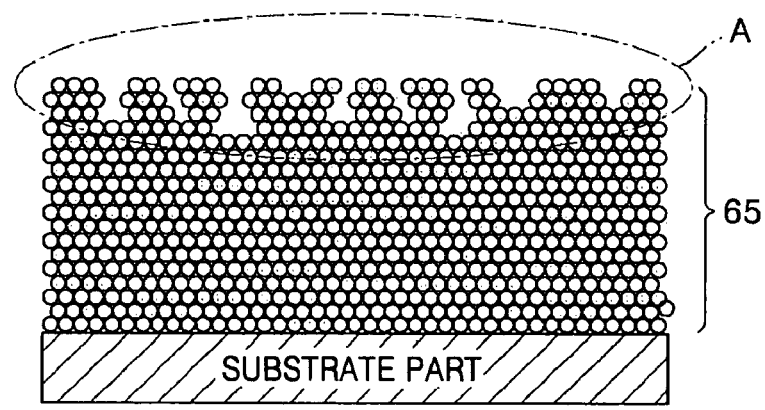
FIG. 2A schematically illustrates an arrangement of atoms constituting a protective layer provided to the organic electroluminescent display device according to an embodiment of the present invention.
Figure 2B:
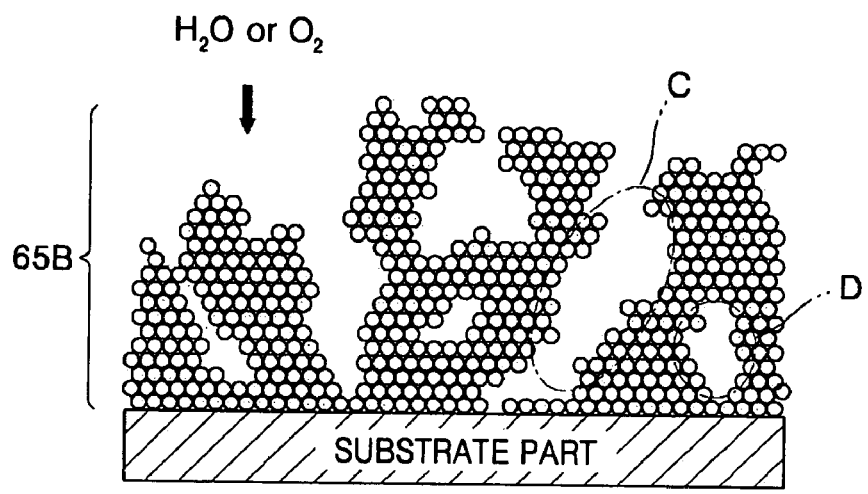
FIG. 2B schematically illustrates an arrangement of atoms constituting a conventional protective layer.

FIG. 2A illustrates an exemplary arrangement of atoms comprising the protective layer 65 in one embodiment of the invention. FIG. 2B illustrates a typical arrangement of atoms in a conventional protective layer.

Referring to FIG. 1, FIG. 2A, and FIG. 2B, atoms constituting the protective layer 65 having the low surface roughness described above tend to be compactly arranged. In contrast, the atoms constituting the conventional protective layer 65B (FIG. 2B) often contain voids C and defects D, which are breakages of the atomic arrangement. As FIG. 2A illustrates, such voids and defects are not substantially present in the compactly arranged protective layer 65 of the present invention. Consequently, the protective layer 65 improves the lifespan of the OLED device 10 by preventing oxygen and/or moisture from permeating through the surface A of the protective layer 65 and into contact with the second electrode 62. When the surface roughness of the protective layer 65 is greater than about 50 Å, the invention's compact atomic structure is not achieved, and thus infiltration of oxygen and/or moisture may not be prevented.

The protective layer 65 may comprise at least one material of either metal oxides or metal nitrides. Examples of the metal oxides and nitrides include $SiO_x$, $SiN_x$ ($x \geq 1$), MgO, TiO, TaO, and CeO, but are not limited thereto.

The protective layer 65 may be about 300 Å to about 3000 Å thick. The thickness of the protective layer 65 may be determined based on a desired level of resistance to infiltration of moisture and oxygen of the protective layer. The thickness of the protective layer 65 may also vary depending on production costs and processing time.

The protective layer 65 may comprise an insulating material that contains a network former material (not shown for convenience).

A "network former" is a material that improves an interatomic network by binding otherwise disconnected networks of atoms constituting a base material. The base material may be an insulating material that both forms the protective layer 65 and contains the network former. Thus, the protective layer 65 of the present invention may not have the substantial voids C among atoms and defects D that are breakages of the atomic arrangement, that are illustratively shown in FIG. 2B. As a result, oxygen and moisture may be prevented from permeating through a surface A of the protective layer 65 and towards the second electrode 62.

The network former-containing insulating material of the protective layer 65 of the present invention may have a refractive index of about 2.0 or greater. When the network former-containing insulating material has a refractive index less than 2.0, the efficiency of light extraction may be reduced due to total reflection of light emitted from an organic layer, and the like.

The network former-containing insulating material of the protective layer 65 of the present invention may have an optical band gap of about 3.0 eV to about 6.0 eV. When the network former-containing insulating material has an optical band gap less than about 3.0 eV, the purpose of using a network former as described above may not be achieved because there is not enough network former. When the network former-containing insulating material has an optical band gap greater than 6.0 eV, the protective layer may become opaque, which also reduces efficiency of light extraction.

Preferably, the network former and its encapsulating insulating material, which constitute the protective layer 65 of the present invention, satisfy the above refractive index and optical band gap requirements to improve the efficiency of light extraction. Examples of the network former include Li, Na, K, Ca, Sn, Rb, Cs, Ba, Pb, Be, Mg, Ce and Nb, but are not limited thereto. Of these elements, Sn is preferable. Examples of the insulating material include metal oxides and metal nitrides, and more specifically, $SiO_x$, $SiN_x$ ($x \geq 1$), MgO, TiO, TaO, CeO, and the like, but are not limited thereto. Of these materials, silicon oxide is preferable.

Examples of the network former-containing insulating material constituting the protective layer 65 of the present invention include metal oxides and nitrides containing the network former as described above, and more specifically, SiLiO, SiNaO, SiKO, SiCaO, SiSnO, SiRbO, SiCsO and SiBaO, but are not limited thereto. Of these materials, SiSnO is preferable.

Figure 3:
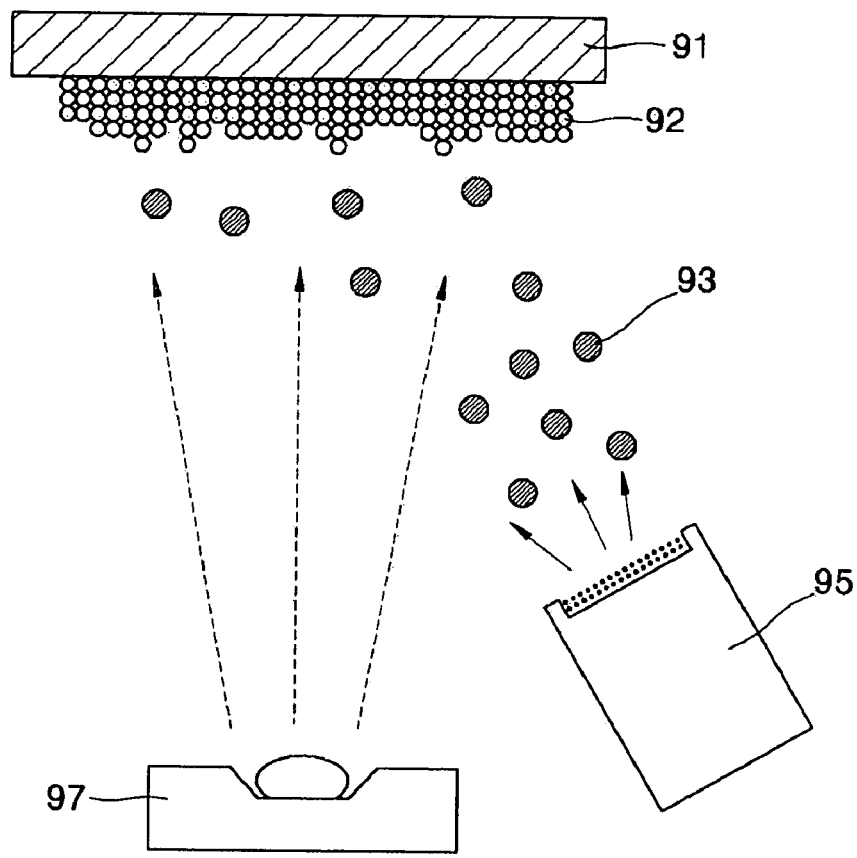
FIG. 3 schematically illustrates a principle of ion beam assisted deposition (IBAD) of the present invention.

As shown in FIG. 3, the protective layer 65 may be formed using an ion beam assisted deposition (IBAD) technique having an evaporation source and an ion beam source.

FIG. 3 illustrates how an exemplary IBAD technique may operate. An evaporation source 97 emits particles 92 that are deposited to a surface of a substrate 91. An ion beam source 95 emits ions 93 that increase the surface mobility of the particles 92 and cause the particles 92 to deposit in a compact manner on the substrate 91.

The particles 92 emitted from the evaporation source 97 may comprise the material that forms the protective layer 65. Examples of suitable particles include metal oxides and metal nitrides, and more specifically, $SiO_x$, $SiN_x$ ($x \geq 1$), MgO, TiO, TaO, and CeO, but are not limited thereto.

The particles 92 may also comprise a network former and its base material. The particles emitted from the evaporation source 97 may include at least one atom of materials such as Li, Na, K, Ca, Sn, Rb, Cs, Ba, Pb, Be, Mg, Ce and Nb, and at least one material among metal oxides and nitrides, but is not limited thereto. Examples of metal oxides and nitrides include $SiO_x$, $SiN_x$ ($x \geq 1$), MgO, TiO, TaO, CeO, and the like, but are not limited thereto. Among these elements and materials, Sn and silicon oxide are preferable.

The evaporation source 97 may include one or more deposition sources. The deposition sources may provide the same type or different types of deposition atoms. For example, a main deposition source disposed in the evaporation source 97 may include two separately prepared secondary deposition sources. One secondary deposition source may provide the network former. The other may provide the insulating material. If necessary, two or more secondary deposition sources composed of different network former may be used. By simultaneously using a deposition source of a network former and a deposition source of an insulating material, the network former and the insulating material may be simultaneously deposited to form a single protective layer 65. A content ratio of the network former to the insulating material in the single layer may be adjusted by controlling the energy source power applied to the network former deposition source and the insulating material deposition source in a predetermined range.

In one embodiment, a network former-insulating material deposition source may comprise a single compound prepared by treating a network former powder and an insulating material powder using a mechanical alloying method. A content ratio of the network former to the insulating material may be adjusted by controlling a mixing ratio of the powders when preparing the network former-insulating material deposition source.

Examples of the network former-containing insulating material constituting the protective layer 65 may include SiLiO, SiNaO, SiKO, SiCaO, SiSnO, SiRbO, SiCsO and SiBaO. Of these materials, SiSnO is preferable.

The ions 93 emitted from the ion beam source 95 of the IBAD should not react with a material constituting a substrate on which a protective layer is formed, for example, a material constituting the second electrode 62 and any particle emitted from the evaporation source as described above. An example of such an ion includes ions of inert gases. More specifically, $Ar^+$, $Kr^+$ or $Xe^+$ ions may be used.

The energy of the ion beam source 95 may be in the range of about 50 eV to about 200 eV, and preferably is about 80 eV to about 150 eV. If the energy of the ion beam source 95 is less than about 50 eV, the energy of ions emitted from the ion beam source is too low to increase the surface mobility of the particles emitted from the evaporation source, and thus a compact protective layer having high hardness and density cannot be formed. If the energy of the ion beam source is greater than about 200 eV, the energy of the ions emitted from the ion beam source may be so high that ions emitted from the ion beam source 95 may etch the protective layer formed. Thus, about 150 eV is preferred.

When forming the protective layer using an IBAD technique, a ratio of the number of particles emitted from the evaporation source 97 to the number of ions emitted from the ion beam source 95 may be 1:1 to 0.9:1, and preferably 0.9:1. If the number of ions emitted from the ion beam source is above this range, the protective layer formed may be etched by ions emitted from the ion beam source. If the number of ions emitted from the ion beam source is below the range, the number of the ions may be too low to increase the surface mobility of the particles emitted from the evaporation source, and thus a compact protective layer having high hardness and density may not form.

The above ratio may be controlled by adjusting either the flux of electrons of the ion beam source 95 or an inflow of a gas used to generate ions. For example, when forming a protective layer 65 composed of silicon oxide by using an evaporation source 97 to emit silicon oxide particles and an ion beam source 95 to emit argon ions, the ratio of the number of silicon oxide particles to the number of argon ions may be controlled to be 1:1 by adjusting an ion flux of the ion beam source 95 to 50 mA and adjusting an inflow of argon gas to 5 sccm. Alternatively, when forming a protective layer composed of SiSnO by using an evaporation source to emit silicon oxide particles and Sn particles and an ion beam source to emit argon ions, the ratio of the number of silicon oxide particles and Sn particles to the number of argon ions may be controlled to be 1:1 by adjusting an electron flux of the ion beam source to 50 mA and adjusting an inflow of argon gas to 5 sccm.

When forming the protective layer using the IBAD, either a thermal evaporation source or an electron beam evaporation source may be used as a main evaporation source. Examples of an ion beam source include a Kaufmann-type ion gun, an Endhall-type ion gun, an rf-type ion gun, and the like. These sources may be easily selected by those skilled in the art according to the purpose of the present invention.

Although the organic electroluminescent display device and the method of preparing the same according to embodiments of the present invention have been described using the active matrix organic electroluminescent display device as an example, the present invention is not limited thereto.

The present invention will now be described in greater detail with reference to the following examples.

EXAMPLE 1

ITO, PEDOT with a thickness of 500 Å, PPV with a thickness of 800 Å, LiF with a thickness of 10 Å, and Al with a thickness of 1000 Å were sequentially deposited on a glass substrate as a substrate on which a silicon oxide layer would be deposited. Thereafter, 1 g of silicon oxide powder was prepared as a silicon oxide deposition source. Then, a container including the silicon oxide deposition source, an ion beam source, a thermal evaporation source, a substrate holder, and a rotation shaft for rotating the substrate holder was prepared. The silicon oxide powder prepared as described above were used as the silicon oxide deposition source, an EndHall-type ion gun (available from Infovion) was used as the ion beam source, and Helisys (available from ANS) was used as the thermal evaporation source. The substrate was mounted in the substrate holder positioned so as to face the silicon oxide deposition source. Then, the container was operated under the conditions as illustrated in Table 1 to form a silicon oxide layer with a thickness of 1000 Å on the substrate.

TABLE 1

| | |
|---|---|
| Basic pressure | $1.0 \times 10^{-7}$ Torr |
| Gas flux | Oxygen flux - 2 sccm |
| | Argon flux - 5 sccm |
| Thermal evaporation source | Tungsten boat, BN boat |
| Operation conditions of thermal evaporation source | 200 A |
| Ion beam source | EndHall-type ion gun |
| Operation conditions of ion beam source | Discharge current - 500 mA |
| | Discharge voltage - 300 V |
| | Beam Voltage - 150 eV |
| | Beam Current - 50 mA |
| Deposition angle | 90° |
| Substrate RPM | 4.5 |
| Temperature of substrate | 80° C. |
| Deposition rate | 5 Å/sec |

The obtained device having the silicon oxide layer is called "Sample 1".

COMPARATIVE EXAMPLE 1

A silicon oxide layer was formed in the same manner as in Example 1, except that in the conditions for operating the container of Example 1, an ion beam source was not used. This device was called "Sample A".

EVALUATION EXAMPLE 1

Evaluation for Surface Morphology of the Silicon Oxide Layer

The surface roughness of the silicon oxide layers of Sample 1 and Sample A was determined through a SEM photograph. As a result, the surface roughness (rms) of the silicon oxide layer of the Sample 1 was 30 Å and the surface roughness (rms) of the silicon oxide layer of the Sample A was 100 Å. As apparent from the results, the silicon oxide layer of the Sample 1 according to the present invention has a superior surface roughness compared to the silicon oxide layer of the Sample A.

EXAMPLE 2

ITO, PEDOT with a thickness of 500 Å, PPV with a thickness of 800 Å, LiF with a thickness of 10 Å, and Mg:Ag with a thickness of 2000 Å were sequentially deposited on a glass substrate as a substrate on which a SiSnO layer would be deposited. Thereafter, 1 g of silicon oxide powder was prepared as a silicon oxide deposition source and 1 g of Sn powder was prepared as an Sn deposition source. Then, a container including an ion beam source, the silicon oxide deposition source, the Sn deposition source, a thermal evaporation source that could separately dispose the silicon oxide deposition source and the Sn deposition source, a substrate holder, and a rotation shaft for rotating the substrate holder was prepared. Those prepared as described above were used as the silicon oxide deposition source and the Sn deposition source, an EndHall-type ion gun (available from Infovion) was used as the ion beam source, and Helisys (available from ANS) was used as the thermal evaporation source. The prepared substrate was mounted in the substrate holder positioned so as to face the silicon oxide deposition source and the Sn deposition source. Then, the container was operated under the conditions as illustrated in the above Table 1 to form a SiSnO layer with a thickness of 300 Å. The device having the SiSnO layer was called "Sample 2".

EVALUATION EXAMPLE 2

Evaluation for Surface Morphology of the SiSnO Layer

The surface roughness of the SiSnO layer of Sample 2 was determined through a SEM photograph. As a result, the surface roughness (rms) of the SiSnO layer of Sample 2 was 30 Å.

EVALUATION EXAMPLE 3

Evaluation for Lifespan Characteristics

Figure 4A:
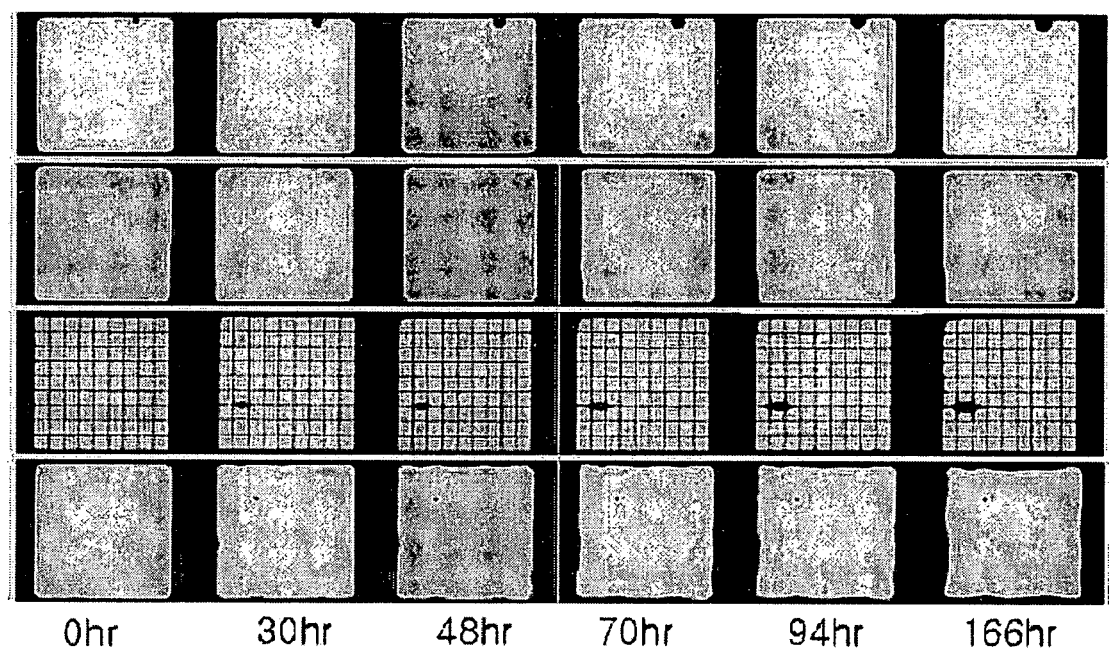
FIGS. 4A, 4B and 4C are photograph showing lifespan characteristics of a device with a protective layer of the present invention.
Figure 4B:
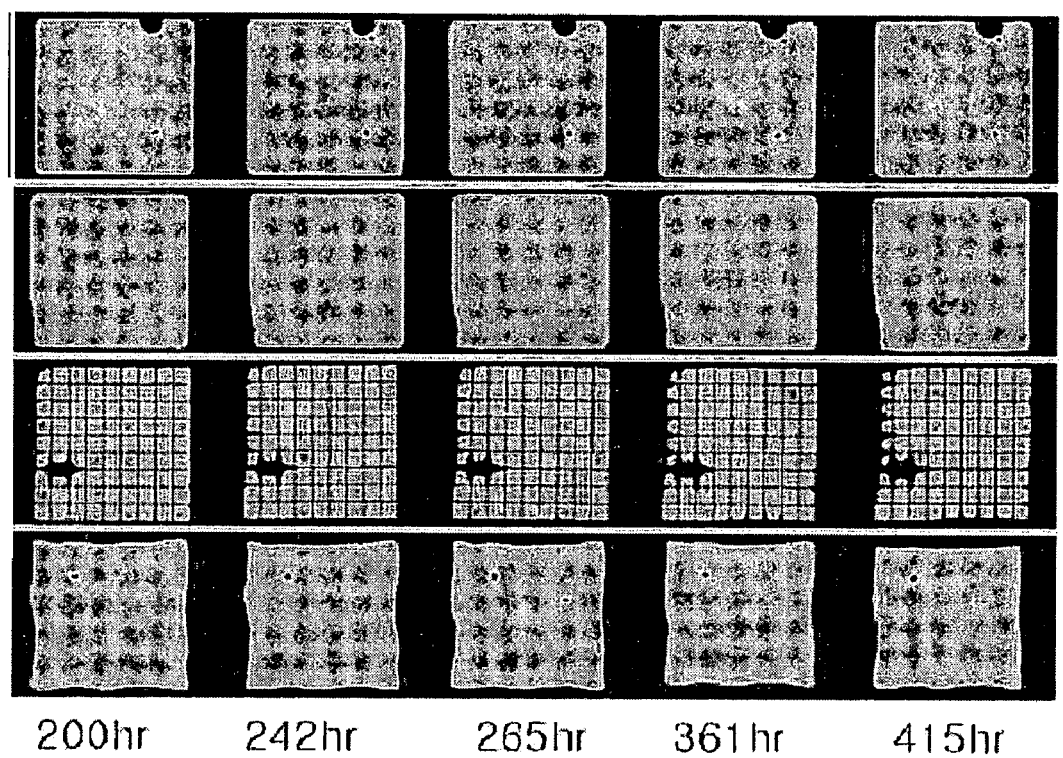
Figure 4C:
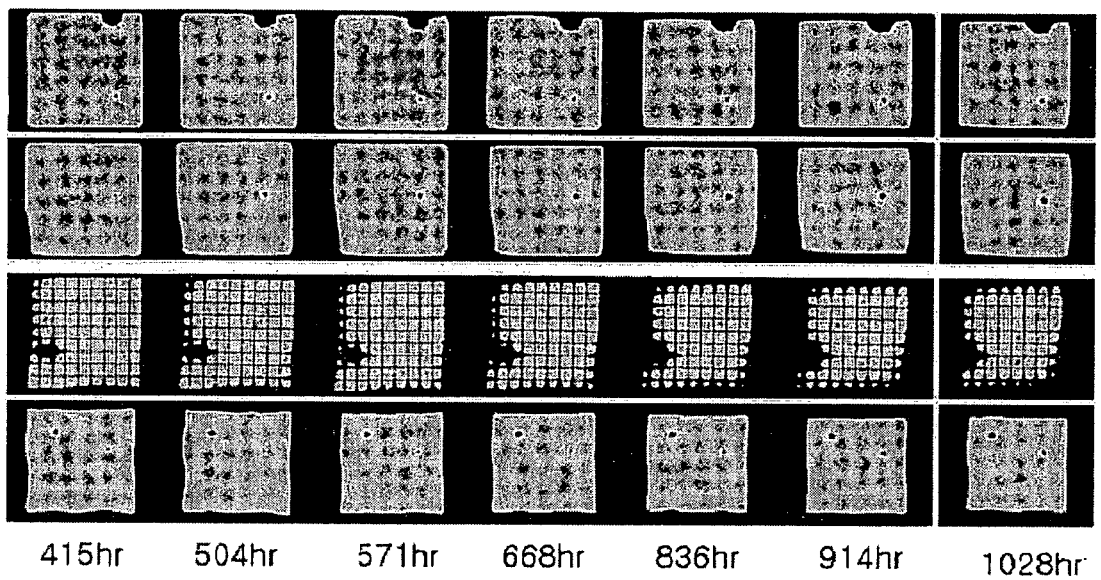

Sample 2 was exposed to air, and then operated for predetermined periods of time to evaluate its lifespan characteristics. The results are illustrated in FIGS. 4A, 4B and 4C where it can be seen that although the size of dark points was constantly grown for 1028 hours, a long lifespan of Sample 2 was ensured.

The protective layer of the present invention has a compact atomic structure with a low surface roughness. The protective layer may comprise a network former-containing insulating material which has high refractive index and optical band gap capable of providing proper clarity to an organic electroluminescent device. Thus, resistance to moisture and oxygen infiltration and light extraction efficiency are superior than the moisture/oxygen resistance found in conventional flat panel displays. The protective layer may be formed using ion beam assisted deposition. Formation and use of the protective layer of the present invention may improve reliability and lifespan of an OLED display.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent display device, comprising:
a first electrode provided on a substrate;
a second electrode formed so as to be insulated from the first electrode;
one or more organic layers interposed between the first electrode and the second electrode and including at least an emission layer; and
a protective layer formed so as to substantially cover the second electrode, the protective layer being non-planar, wherein the protective layer has a surface roughness (rms) of 5 Å to 50 Å,
wherein the protective layer is composed of an insulating material containing a network former, and
wherein the insulating material containing the network former has a refractive index of 2.0 or greater and an optical band gap of about 3.0 eV to about 6.0 eV.

2. The organic electroluminescent display device of claim 1, wherein the protective layer is composed of at least one material selected from the group consisting of metal oxides and metal nitrides.

3. The organic electroluminescent display device of claim 1, wherein the protective layer is composed of at least one material selected from the group consisting of $SiO_x$, $SiN_x$ ($x \geq 1$), MgO, TiO, TaO, and CeO.

4. The organic electroluminescent display device of claim 1, wherein the protective layer is formed using ion beam assisted deposition (IBAD) using an evaporation source and an ion beam source.

5. An organic electroluminescent display device, comprising:
a first electrode provided on a substrate;
a second electrode formed so as to be insulated from the first electrode;
one or more organic layers interposed between the first electrode and the second electrode and including at least an emission layer; and
a protective layer formed so as to substantially cover the second electrode, the protective layer being non-planar, wherein the protective layer is composed of an insulating material containing a network former,
wherein the insulating material containing the network former has a refractive index of 2.0 or greater, and
wherein the insulating material containing the network former has an optical band gap of about 3.0 eV to about 6.0 eV.

6. The organic electroluminescent display device of claim 5, wherein the insulating material containing the network former is at least one atom selected from the group consisting of Li, Na, K, Ca, Sn, Rb, Cs, Ba, Pb, Be, Mg, Ce and Nb.

7. The organic electroluminescent display device of claim 5, wherein the insulating material comprises at least one material selected from the group consisting of metal oxides and metal nitrides.

8. The organic electroluminescent display device of claim 5, wherein the insulating material containing the network former is at least one material selected from the group consisting of SiLiO, SiNaO, SiKO, SiCaO, SiSnO, SiRbO, SiCsO and SiBaO.

9. The organic electroluminescent display device of claim 5, wherein the protective layer is formed using ion beam assisted deposition (IBAD) using an evaporation source and an ion beam source.

* * * * *